United States Patent
Lu et al.

(10) Patent No.: US 8,598,042 B1
(45) Date of Patent: Dec. 3, 2013

(54) DEVICE MANUFACTURING AND CLEANING METHOD

(75) Inventors: Chi-Lun Lu, Hsinchu (TW); Kuan-Wen Lin, Taichung (TW); Ching-Wei Shen, Taichung (TW); Ting-Hao Hsu, Hsinchu (TW); Sheng-Chi Chin, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/486,243

(22) Filed: Jun. 1, 2012

(51) Int. Cl.
*H01L 21/302* (2006.01)

(52) U.S. Cl.
USPC ........... 438/725; 438/624; 438/639; 438/660; 438/689; 438/690; 257/615; 257/616; 257/618; 257/635; 257/E21.206

(58) Field of Classification Search
None
See application file for complete search history.

(56) References Cited

U.S. PATENT DOCUMENTS

| | | | |
|---|---|---|---|
| 5,466,389 A * | 11/1995 | Ilardi et al. | 510/175 |
| 6,012,469 A * | 1/2000 | Li et al. | 134/1.3 |
| 6,280,527 B1 | 8/2001 | Sachdev et al. | |
| 2007/0037400 A1 * | 2/2007 | Hwang et al. | 438/753 |
| 2012/0073610 A1 * | 3/2012 | Kamimura | 134/26 |

OTHER PUBLICATIONS

Tun Ming Pan et al., "Novel Cleaning Solutions for Polysilicon Film Post Chemical Mechanical Polishing," IEEE Electron Device Letters, vol. 21, No. 7, Jul. 2000, pp. 338-340.

Tun Ming Pat et al., "Performance Evaluation of Cleaning Solutions Enhanced with Tetraalkylammonium Hydroxide Substituents for Post-CMP Cleaning on Poly-Si Film," Journal of the Electrochemical Society, 149 (6) G336-G342 (2002), pp. G336-G342.

* cited by examiner

*Primary Examiner* — Kyoung Lee
(74) *Attorney, Agent, or Firm* — Haynes and Boone, LLP

(57) ABSTRACT

A method of manufacturing is disclosed. An exemplary method includes providing a substrate and forming one or more layers over the substrate. The method further includes forming a surface layer over the one or more layers. The method further includes performing a patterning process on the surface layer thereby forming a pattern on the surface layer. The method further includes performing a cleaning process using a cleaning solution to clean a top surface of the substrate. The cleaning solution includes tetra methyl ammonium hydroxide (TMAH), hydrogen peroxide ($H_2O_2$) and water ($H_2O$).

20 Claims, 11 Drawing Sheets

DEVICE MANUFACTURING AND CLEANING METHOD

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, the requirement for a cleaner surface during the manufacturing process is becoming more stringent. The existing cleaning processes and cleaning solutions, however, may result in critical dimension (CD) loss and damage to layers exposed to the cleaning solution during the cleaning process. As such, the cleanliness of a surface may be limited by the potential of CD loss/damage. Accordingly, although existing methods of manufacturing and cleaning devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
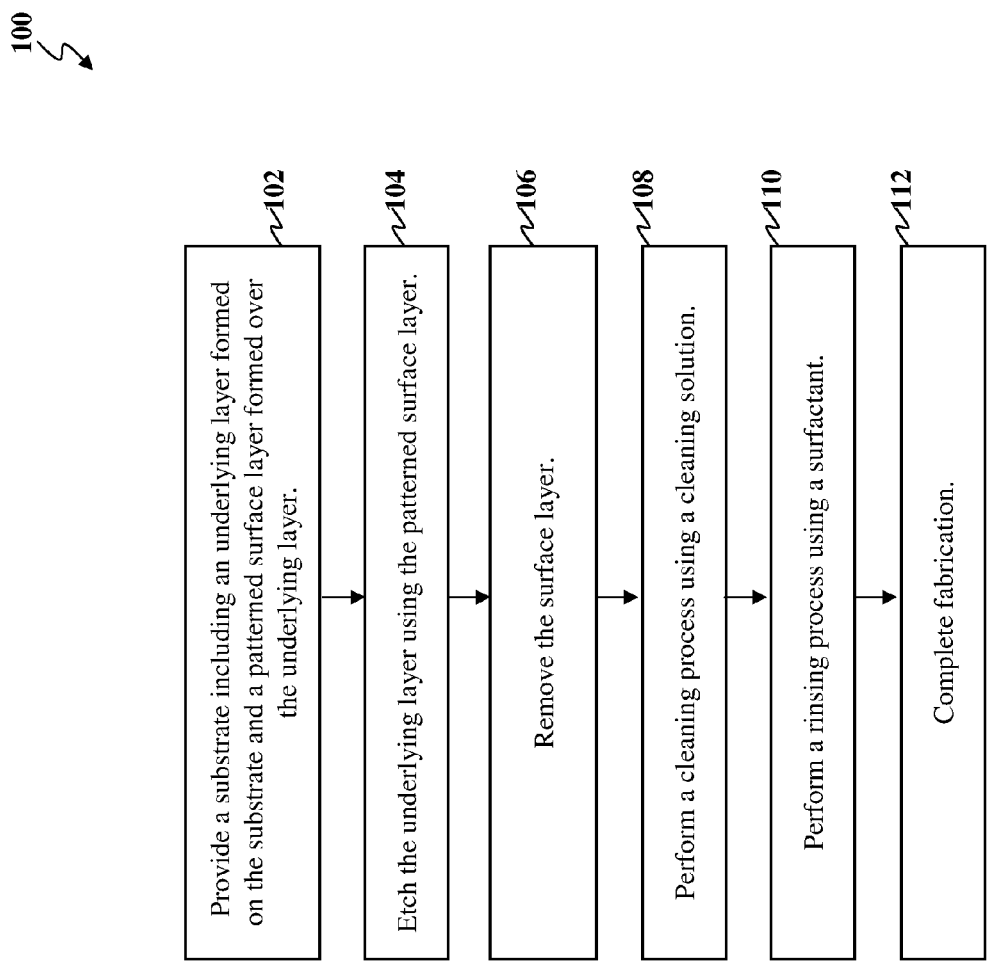
FIG. 1 is a flowchart of one embodiment of a method 100 for manufacturing and cleaning a structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

With reference to FIG. 1, a method 100 of cleaning a surface of a structure begins at block 102 where a semiconductor substrate is provided. Further, formed over the substrate is an underlying layer, and formed over the underlying layer is a patterned surface layer. At block 104, the patterned surface layer is used to etch at least one underlying layer. At block 106, the patterned surface layer is removed. The method 100 continues with block 108 where a cleaning process is performed to remove contamination from the surface of the structure. The cleaning process uses a cleaning solution that may include tetra methyl ammonium hydroxide (TMAH), hydrogen peroxide ($H_2O_2$) and water ($H_2O$). In alternative embodiments, the cleaning solution includes TBAH. At block 110, a rinsing process is performed using a surfactant to further remove contamination and/or cleaning solution. The method 100 continues with block 112 where fabrication is completed. Additional steps can be provided before, during, and after the method 100, and some of the steps described can be replaced or eliminated for other embodiments of the method. The discussion that follows illustrates various embodiments of a process according to the method 100 of FIG. 1.

FIGS. 2 to 6 illustrate diagrammatic sectional views of one embodiment of manufacturing and cleaning a structure 200 at various stages, according to the method 100 of FIG. 1. In the present embodiment, the structure 200 includes a semiconductor wafer. It is understood that the structure 200 may be any structure that may benefit from the present disclosure. Further, it is understood that the structure 200 may include various devices and features, such as other types of transistors such as bipolar junction transistors, resistors, capacitors, diodes, fuses, etc. FIGS. 2-6 have been simplified for the sake of clarity to better understand the inventive concepts of the present disclosure. Additional features can be added in the structure 200, and some of the features described below can be replaced or eliminated in other embodiments of the structure 200.

Figure 2:
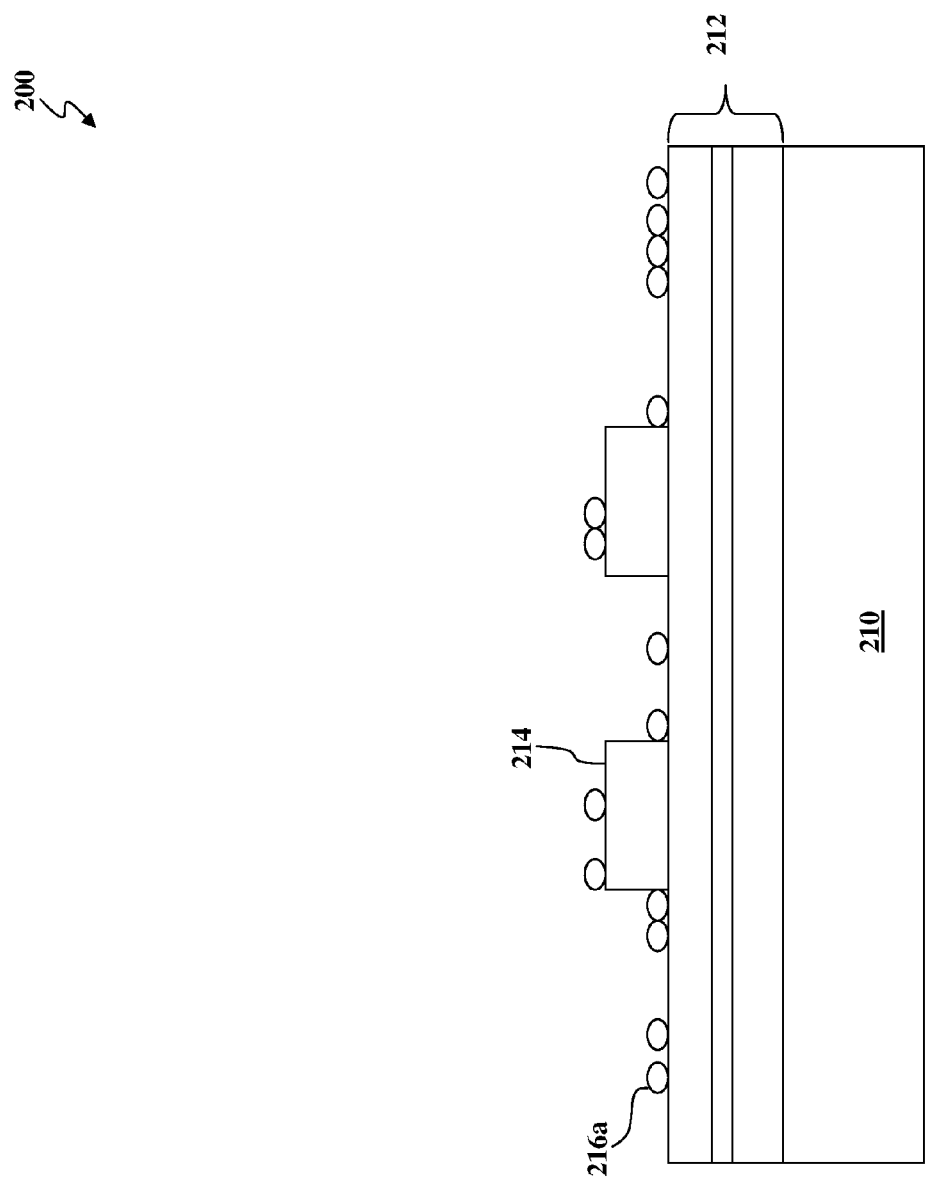
FIGS. 2 to 6 illustrate diagrammatic sectional views of one embodiment of a structure at various stages, according to the method 100 of FIG. 1.

Referring to FIG. 2, the structure 200 includes a semiconductor substrate 210. In the present embodiment the semiconductor substrate 210 is a substrate of a semiconductor wafer. The semiconductor substrate 210, for example, includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

Still referring to FIG. 2, formed over a surface of the semiconductor substrate 210 are one or more underlying layers 212 including various materials such as conductive materials and dielectric materials. The underlying layers 212 can include patterned and unpatterned layers. Forming the underlying layers 212 may include single or multiple patterning and deposition processes, etching processes, chemical mechanical polishing (CMP) processes, a combination of these processes, or any other suitable process.

Still referring to FIG. 2, formed over the underlying layers 212 is a surface layer 214. The surface layer 214 may be a patterned or an unpatterned layer. Depending on the purpose of the surface layer 214, the surface layer 214 may include a dielectric material, a conductive material, a combination thereof, or any other suitable material. Forming the surface layer 214 may include single or multiple patterning and deposition processes, wet/dry etching processes, chemical mechanical polishing (CMP) processes, a combination of these processes, or any other suitable process. In the present embodiment, for example, the surface layer 214 is a photoresist layer patterned by any suitable process. Patterning the photoresist layer may include exposing the photoresist layer to a pattern, performing a post-exposure bake process, and developing the photoresist layer thereby forming a patterned photoresist layer. The patterning may also be implemented or replaced by other proper methods, such as maskless photolithography, electron-beam writing, ion-beam writing, and molecular imprint. As such, in the present embodiment, the surface layer 214 (photoresist) is a temporary layer used in processing of the final device and which will ultimately be removed. It is understood that the surface layer 214 may be a permanent layer that will be included in a final device and may be formed of and/or include any other suitable conductive and/or dielectric materials, according to design requirements.

After the formation of the patterned surface layer 214, contamination debris 216a such as organic particles, particles from the patterned surface layer 214, particles from other layers, particles from processing solutions, or other unwanted contaminants may be present on exposed surfaces of the surface layer 214 or on exposed surfaces of the underlying layers 212. The debris 216a may be evenly or unevenly disbursed on all or some of the exposed surfaces. Therefore contamination debris 216a may include the debris 216 (FIG. 2)

Figure 3:
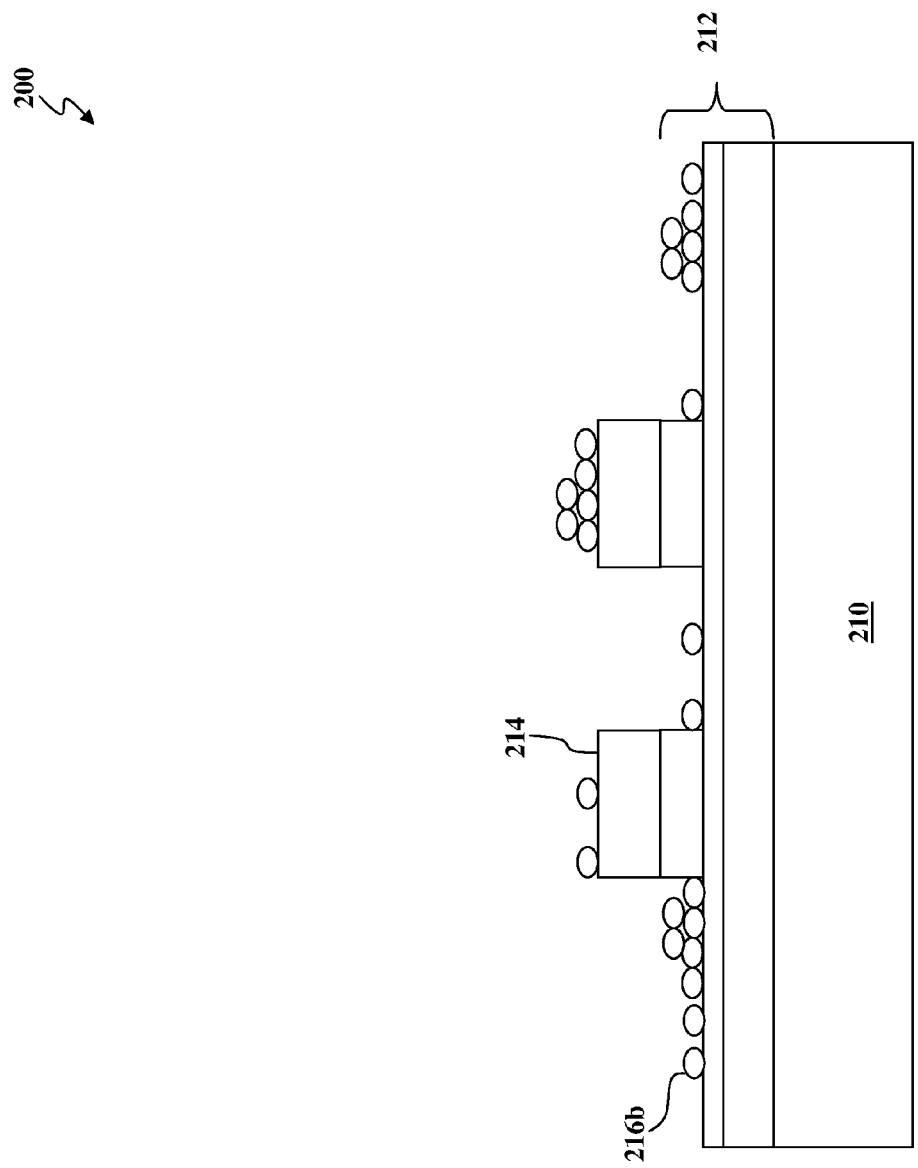

Referring to FIG. 3, after the formation of the patterned surface layer 214, part of one or more of the underlying layers 212 is removed by an etching process, thereby forming a pattern thereon. The etching process uses the patterned surface layer 214 to define the area to be etched. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the underlying layers 212 that includes fluorine-containing gas. In furtherance of the example, the chemistry of the dry etch includes CF4, SF6, or NF3. After the etching process, contamination debris 216b such as organic particles, particles from the patterned surface layer 214, particles from other layers, particles from processing solutions, or other unwanted contaminants may be present on exposed surfaces of the surface layer 214 or on exposed surfaces of the underlying layers 212. The contamination debris 216b may be evenly or unevenly disbursed on all or some of the exposed surfaces. The contamination debris 216b may include the debris 216a of FIG. 2.

Figure 4:
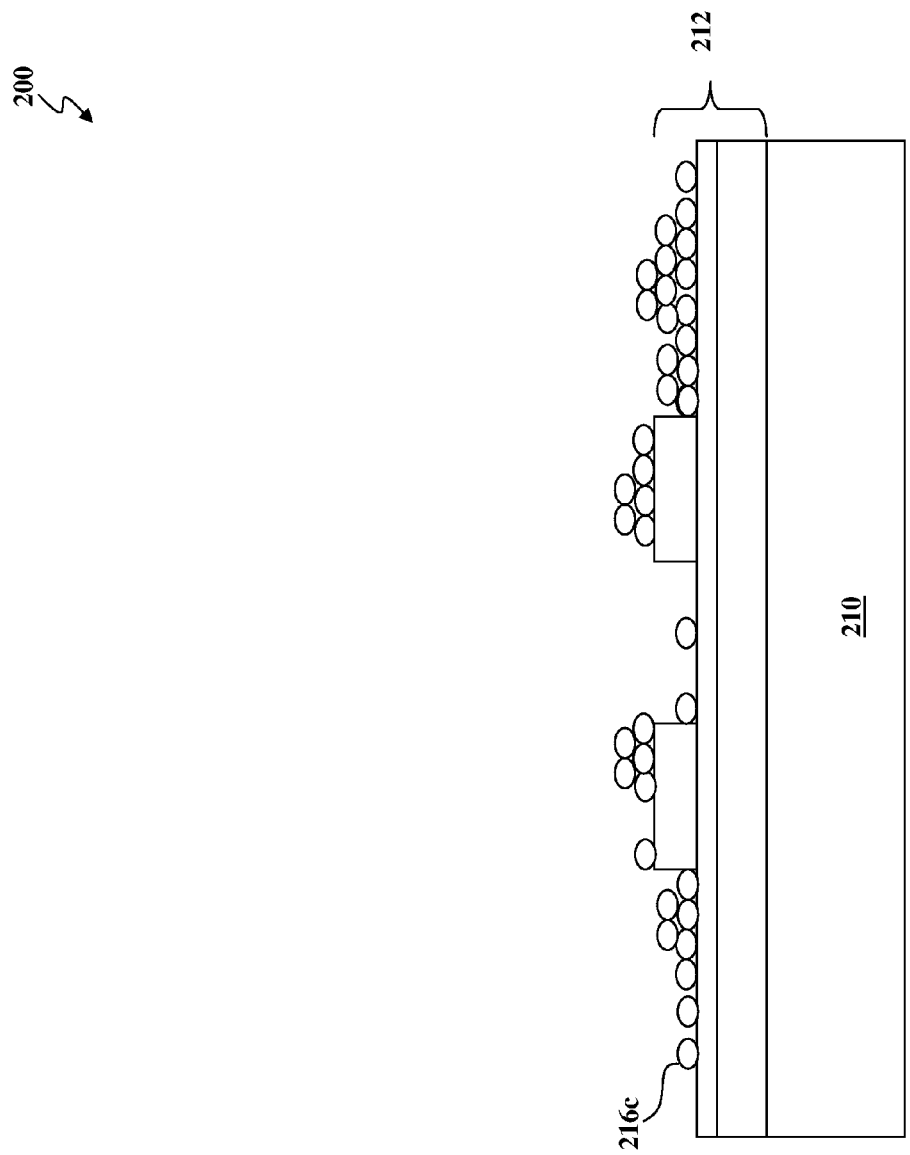

Referring to FIG. 4, in the present embodiment, after the etching process, the surface layer 214 is removed by any suitable process. For example, the surface layer 214 (photoresist) may be removed by a liquid "resist stripper", which chemically alters the resist so that it no longer adheres to the underlying hardmask. Alternatively, surface layer 214 may be removed by a plasma containing oxygen, which oxidizes it. Removing the surface layer 214 may further create debris 216 on exposed surfaces of the underlying layers 212. In alternative embodiments, the surface layer 214 is removed during the cleaning process, as disclosed below. After the removing the surface layer 214, contamination debris 216c such as organic particles, particles from the patterned surface layer 214, particles from other layers, particles from processing solutions, or other unwanted contaminants may be present on exposed surfaces of the underlying layers 212. The contamination debris 216c may be evenly or unevenly disbursed on all or some of the exposed surfaces. The contamination debris 216c may include the debris 216b of FIG. 3 and/or debris 216a of FIG. 2.

Figure 5:
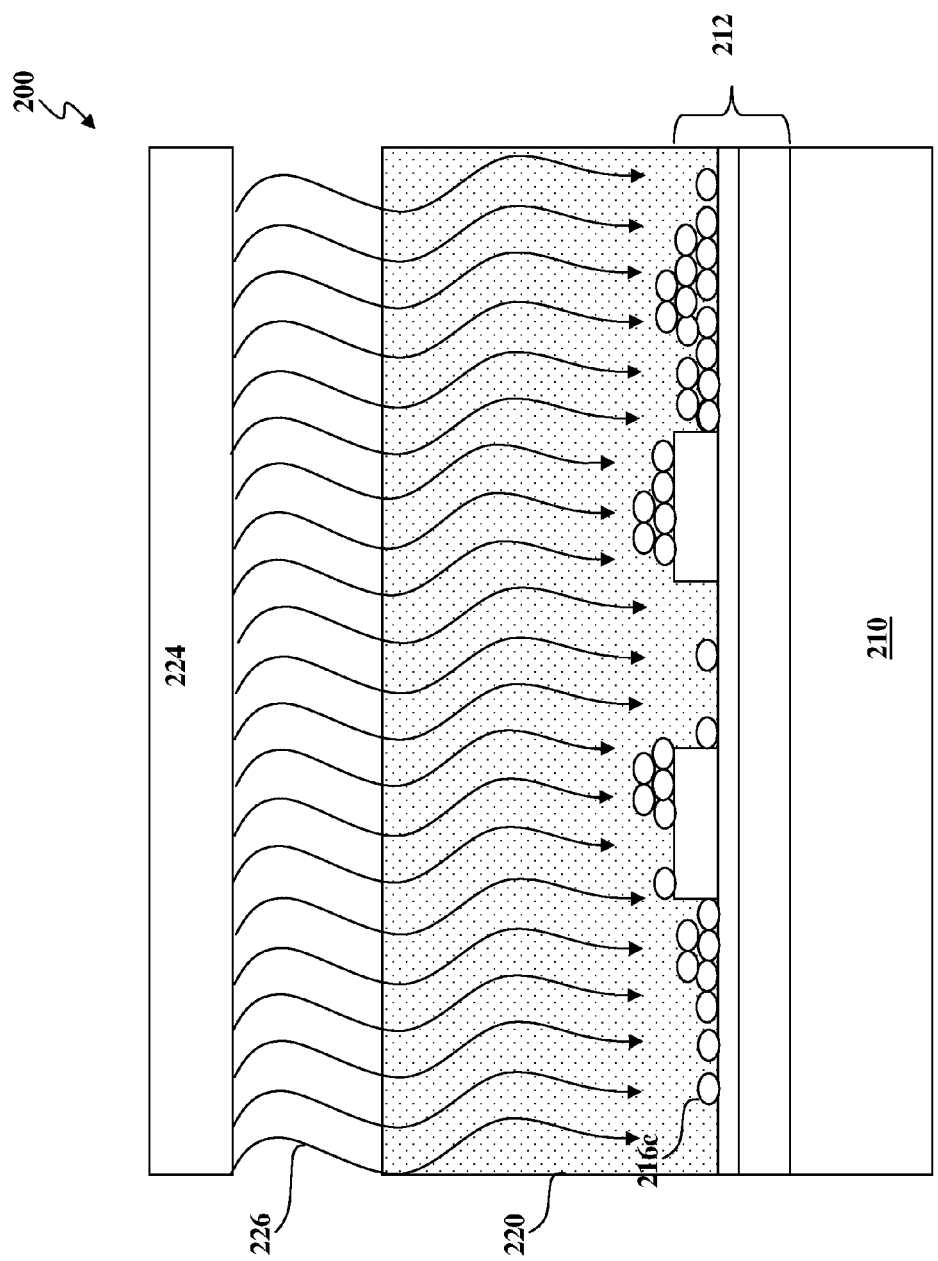

Referring to FIG. 5, a cleaning process is performed on the structure 200 to remove debris 216 or other contamination. In the present embodiment, performing the cleaning process includes exposing the contaminated structure 200 to a cleaning solution 220 including tetra methyl ammonium hydroxide (TMAH). In alternative embodiments, the cleaning solution 220 does not include TMAH but rather includes tetrabutylammonium hydroxide (TBAH). In still further embodiments, the cleaning solution 220 includes a combination of both TMAH and TBAH. The present embodiment will proceed with the cleaning solution including only TMAH, however, it is understood that the description that follows is equally applicable to the alternative embodiments that include TBAH or a combination of both TMAH and TBAH. In the present embodiment, the cleaning solution 220 further includes hydrogen peroxide ($H_2O_2$) and water ($H_2O$), thereby diluting the cleaning solution 220 including TMAH. As such, the cleaning solution 220 may be a solution having a concentration of TMAH of less than about 2.38 wt %. For example, the cleaning solution 220 may be an ultra-dilute solution having a concentration of TMAH of from about 0.1 wt % to about 0.003 wt %. Because the TMAH concentration is less than 2.38 wt %, there is relatively little/minimal etching of certain films, such as, for example, Si of a wafer and MoSi film. Depending on the chemicals included and concentration of the respective chemicals, the cleaning solution 220 may have a pH ranging from about 10 to about 14 and a zeta-potential ranging from about −100 mV to about −160 mV.

In the present embodiment, the cleaning solution 220 includes a surfactant to enhance particle removal capability. The surfactant may be cationic, antonic, or nonionic surfactant. The surfactant may be a commercially available surfactant such as BASF C-2101, or any suitable surfactant. When the surfactant is put into the cleaning solution 220, it will readily dissolve if the surfactant concentration is low. The surfactant concentration may range from about 0.001 wt % to about 1.0 wt %.

The structure 200 may be exposed to the cleaning solution 220 by any appropriate processes. For example, the structure 200 may be dipped and/or immersed into the cleaning solution 220. Alternatively, the cleaning solution 220 may be sprayed on the exposed surface of the structure 200. In the present embodiment, the structure 200 is dipped and/or immersed into the cleaning solution 220. After the structure 200 has been exposed to the cleaning solution 220, the debris 216 and/or other contaminants have been substantially removed.

With continued reference to FIG. 5, in the present embodiment, while the structure 200 is immersed into the cleaning solution 220, the structure 200 is exposed to UV lamp 224 irradiation 226 to aid in the removal of debris 216c (which may include debris 216b and 216a) and/or other contaminants. Further, in embodiments where the surface layer 214 has not yet been removed, the UV irradiation 226 functions to destroy and/or remove the surface layer 214 (photoresist). In alternative embodiments, the structure 200 is not exposed to the UV lamp 224 irradiation 226 and the surface layer 214 is not removed, thereby allowing the surface layer 214 to be used in subsequent processing. In an alternative embodiment, a cleaning process, substantially similar to the cleaning process described above, is performed on the structure 200 prior to the etching process of FIG. 3.

Figure 6:
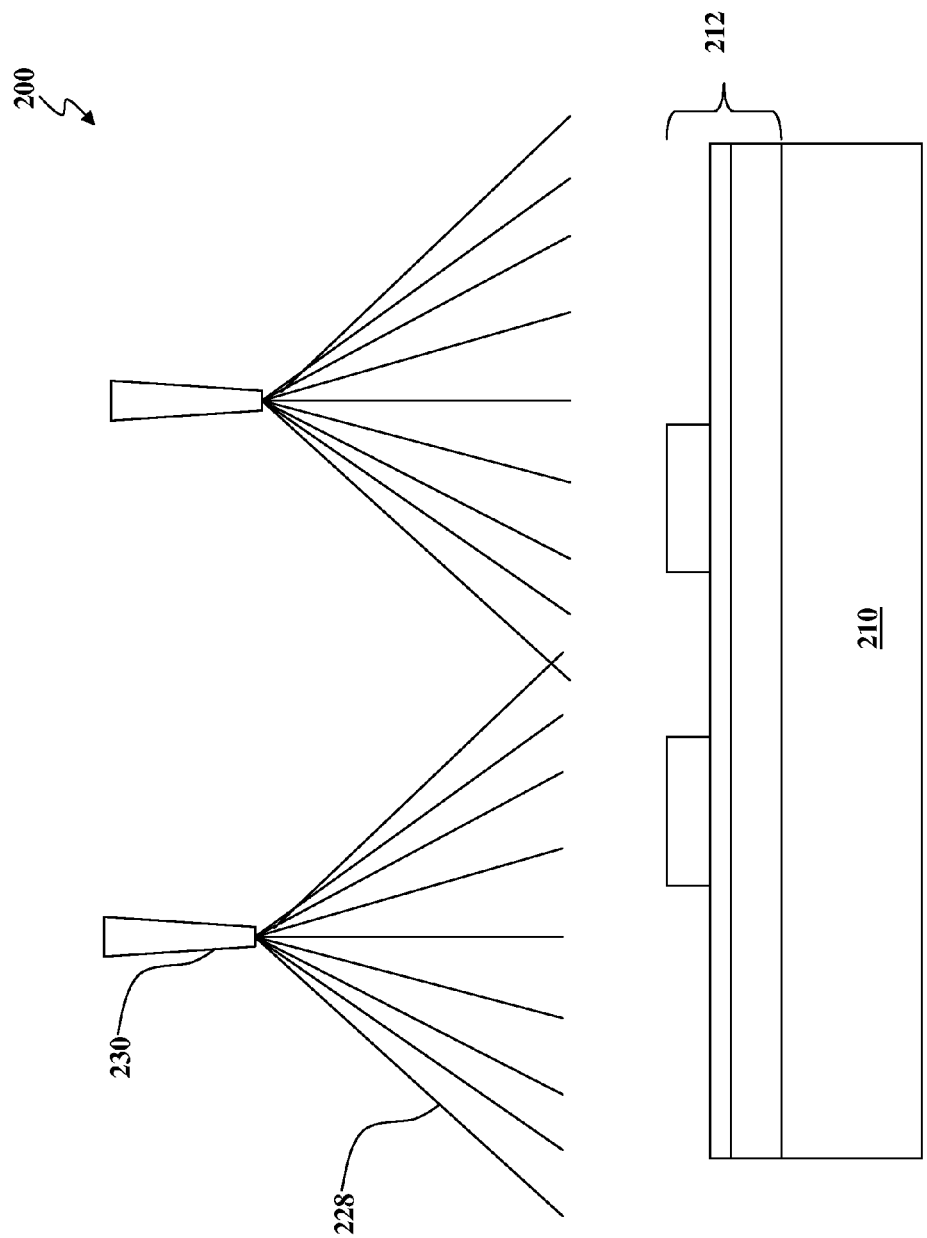

With reference to FIG. 6, in the present embodiment, after exposing the structure 200 to the cleaning solution 220 and removing the surface layer 214 (by either stripping or exposing the surface layer 214 to the UV irradiation during the cleaning), the cleaned structure 200 is rinsed with a surfactant 228 to remove any cleaning solution 220 that remains and/or make the surface hydrophobic, thereby preventing re-deposition of contaminants such as debris/particles, or other unwanted materials. The surfactant 228 may be cationic, antonic, or nonionic. The surfactant 228, for example, may be a surfactant such as BASF C-2101, or any suitable surfactant. The surfactant 228 is sprayed by one or more nozzle 230 onto the surface of the structure 200 to thereby rinse the structure 200. Alternatively, the structure 200 may be dipped and/or immersed into the surfactant 228, or exposed to the surfactant 228 by any suitable process, thereby rinsing the structure 200. In alternative embodiments, the structure 200 is not exposed to a surfactant after exposing the structure 200 to the cleaning solution 220.

Figure 7:
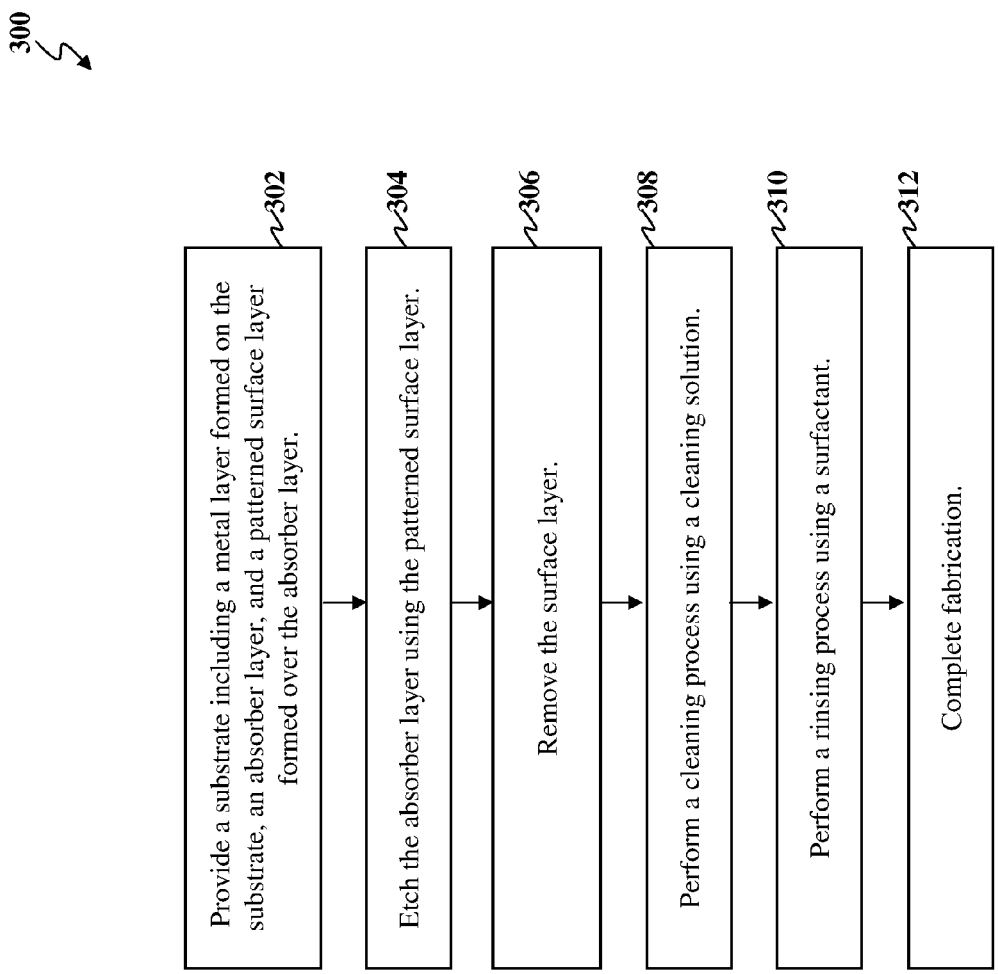
FIG. 7 is a flowchart of one embodiment of a method 300 for manufacturing and cleaning a structure according to various aspects of the present disclosure.

With reference to FIG. 7, a method 300 of cleaning a surface of a structure is described below. The method 300 begins at block 302 where a substrate is provided. In the present embodiment, the substrate is a substrate of a reticle/photomask. The substrate, for example, may be the substrate of an EVU reticle or a DUV reticle. Further, formed over the substrate is a metal layer, formed over the metal layer is an absorber layer, and formed over the absorber layer is a patterned surface layer. A capping layer may be interposed between the metal layer and the absorber layer. At block 304, the patterned surface layer is used to etch the absorber layer. At block 306, the patterned surface layer is removed. The method 300 continues with block 308 where a cleaning process is performed to remove contamination from the surface of the structure. The cleaning process uses a cleaning solution that may include tetra methyl ammonium hydroxide (TMAH), hydrogen peroxide ($H_2O_2$) and water ($H_2O$). In alternative embodiments, the cleaning solution includes TBAH. At block 310, a rinsing process is performed using a surfactant to further remove contamination and/or cleaning solution. The method 300 continues with block 312 where fabrication is completed. Additional steps can be provided before, during, and after the method 300, and some of the steps described can be replaced or eliminated for other embodiments of the method. The discussion that follows illustrates various embodiments of a process according to the method 300 of FIG. 7.

FIGS. 8 to 11 illustrate diagrammatic sectional views of one embodiment of a structure 400 at various stages, according to the method 300 of FIG. 7. It is understood that the structure 400 may be any structure that may benefit from the present disclosure. Further, it is understood that the structure 400 may include various other features. FIGS. 8-11 have been simplified for the sake of clarity to better understand the inventive concepts of the present disclosure. Additional features can be added in the structure 400, and some of the features described below can be replaced or eliminated in other embodiments of the structure 400.

Figure 8:
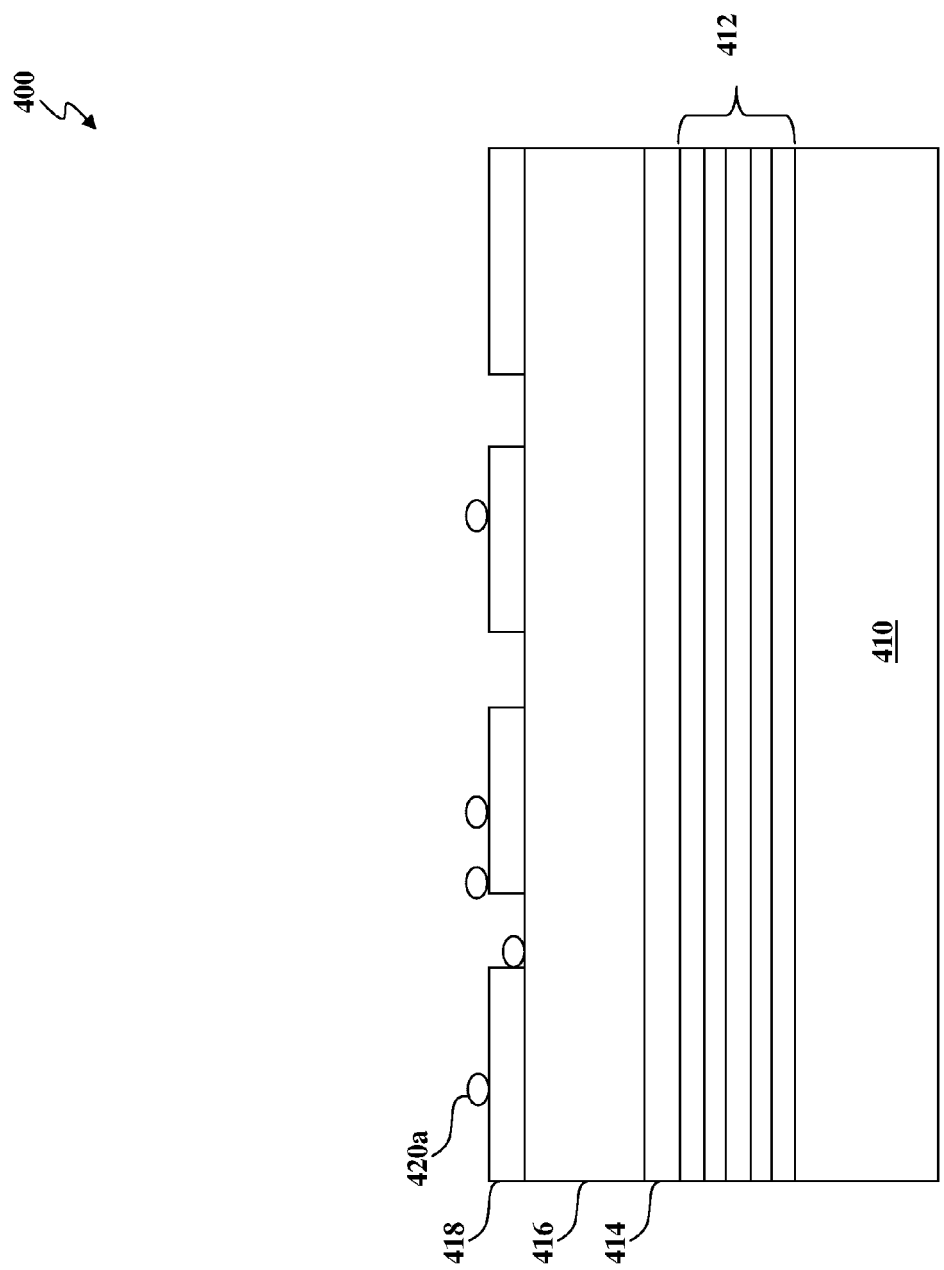
FIGS. 8 to 11 illustrate diagrammatic sectional views of one embodiment of a structure at various stages, according to the method 300 of FIG. 7.

Referring to FIG. 8, the structure 400 includes a substrate 410. In the present embodiment the substrate 410 is a substrate of a reticle/photomask. The reticle/photomask may be an extreme ultraviolet (EVU) photomask or a deep ultraviolet (DUV) photomask. The substrate 410 may include a material such as quartz, a ultra low expansion (ULE) material, a low thermal expansion material (LTEM), or any other suitable material.

Still referring to FIG. 8, formed over a surface of the substrate 410 is a metal layer (ML) 412 including one or more layers of materials. For example, the ML 412 may include alternating materials such as molybdenum (Mo) and silicon (Si), or any other suitable materials. ML 412 may be formed by any suitable processing including chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Still referring to FIG. 8, formed over ML 412 is a capping layer 414 used to protect the underlying layers. The capping layer 414 may include a material such as ruthenium (Ru), or any other suitable material. The capping layer 414 may be formed by any suitable process such as chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

With further reference to FIG. 8, formed over the capping layer 414 is an absorber 416. The absorber 416 may include a material such as silver oxide TaN/TaON, TaBn/TaBo, TaBn, Ag2O, or any other suitable material. The absorber 416 may be formed having a thickness T ranging from about 60 nanometers (nm) to about 10 nm. In the present embodiment, the thickness T of the absorber 416 is about 32 nm. The absorber 416 is formed by any suitable process such as chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6).

Formed over the absorber 416 is a surface layer 418. The surface layer 418 may be a patterned or an unpatterned layer. Forming the surface layer 418 may include single or multiple patterning and deposition processes, wet/dry etching processes, chemical mechanical polishing (CMP) processes, a combination of these processes, or any other suitable process. In the present embodiment, for example, the surface layer 418 is a photoresist layer patterned by any suitable process. Patterning the surface layer 418 may include exposing the surface layer 418 to a pattern, performing a post-exposure bake process, and developing the surface layer 418 (photoresist) thereby forming a patterned surface layer 418 (photoresist). The patterning may also be implemented or replaced by other proper methods, such as maskless photolithography, electron-beam writing, ion-beam writing, and molecular imprint. As such, in the present embodiment, the surface layer 418 (photoresist) is a temporary layer used in processing of the final device and which will ultimately be removed. It is understood that the surface layer 418 may be a permanent layer that will be included in a final device and may be formed of and/or include any other suitable conductive and/or dielectric materials, according to design requirements.

After the formation of the patterned surface layer 418, contamination debris 420a such as organic particles, particles from the patterned surface layer 418, particles from other layers, particles from processing solutions, or other unwanted contaminants may be present on exposed surfaces of the surface layer 418 or on exposed surfaces of the absorber 416. The contamination debris 420a may be evenly or unevenly disbursed on all or some of the exposed surfaces.

Figure 9:
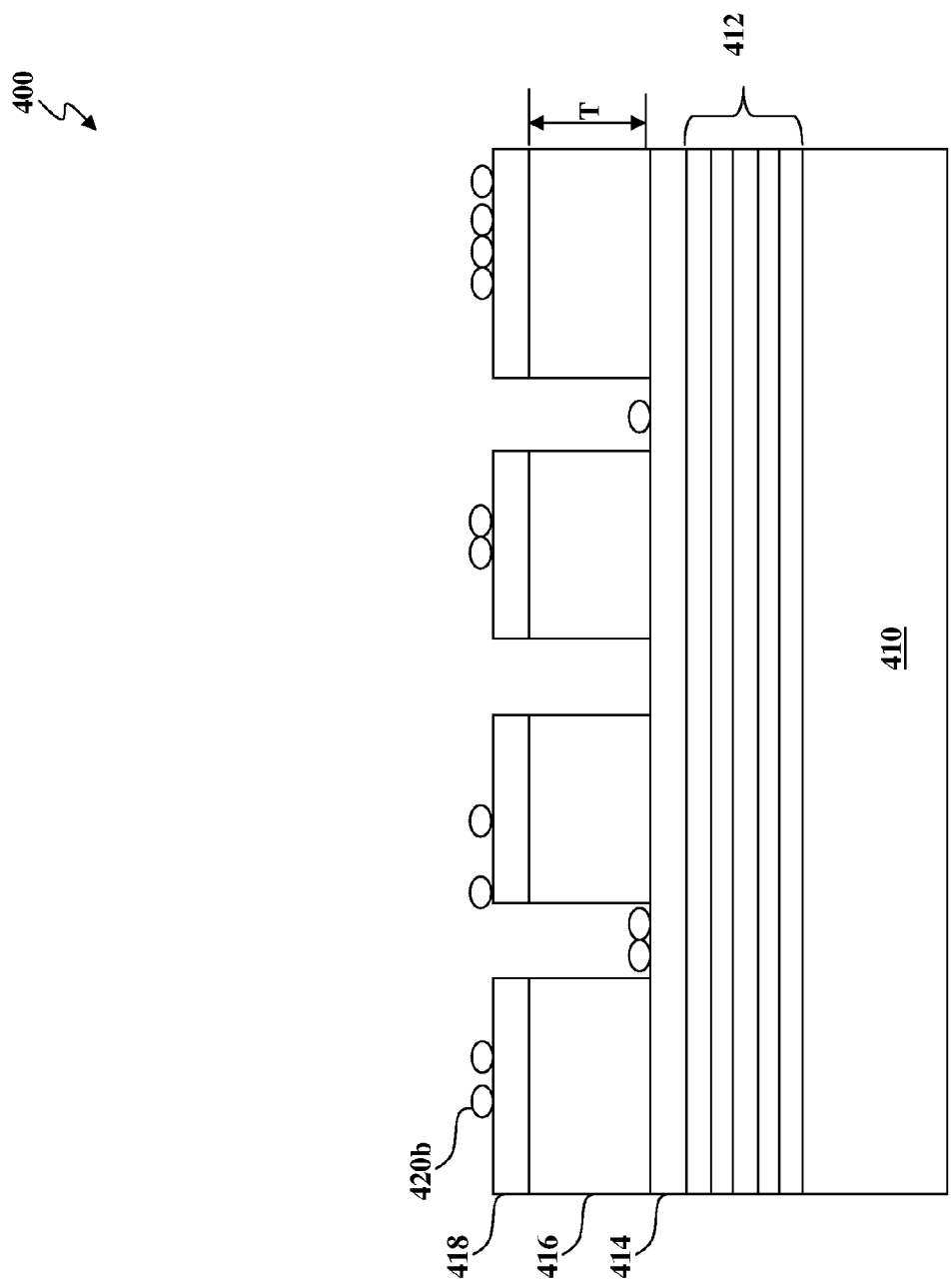

Referring to FIG. 9, after the formation of the patterned surface layer 418, part of the absorber 416 is removed by an etching process, thereby exposing the top surface of the capping layer 414. The etching process uses the patterned surface layer 418 to define the area to be etched. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the absorber 416 that includes $Cl_2+O_2$ gas. After the etching process, additional contamination debris 420b may be formed and present on all or some of the exposed surfaces. The contamination debris 420b may include the contamination debris 420a of FIG. 8.

Figure 10:
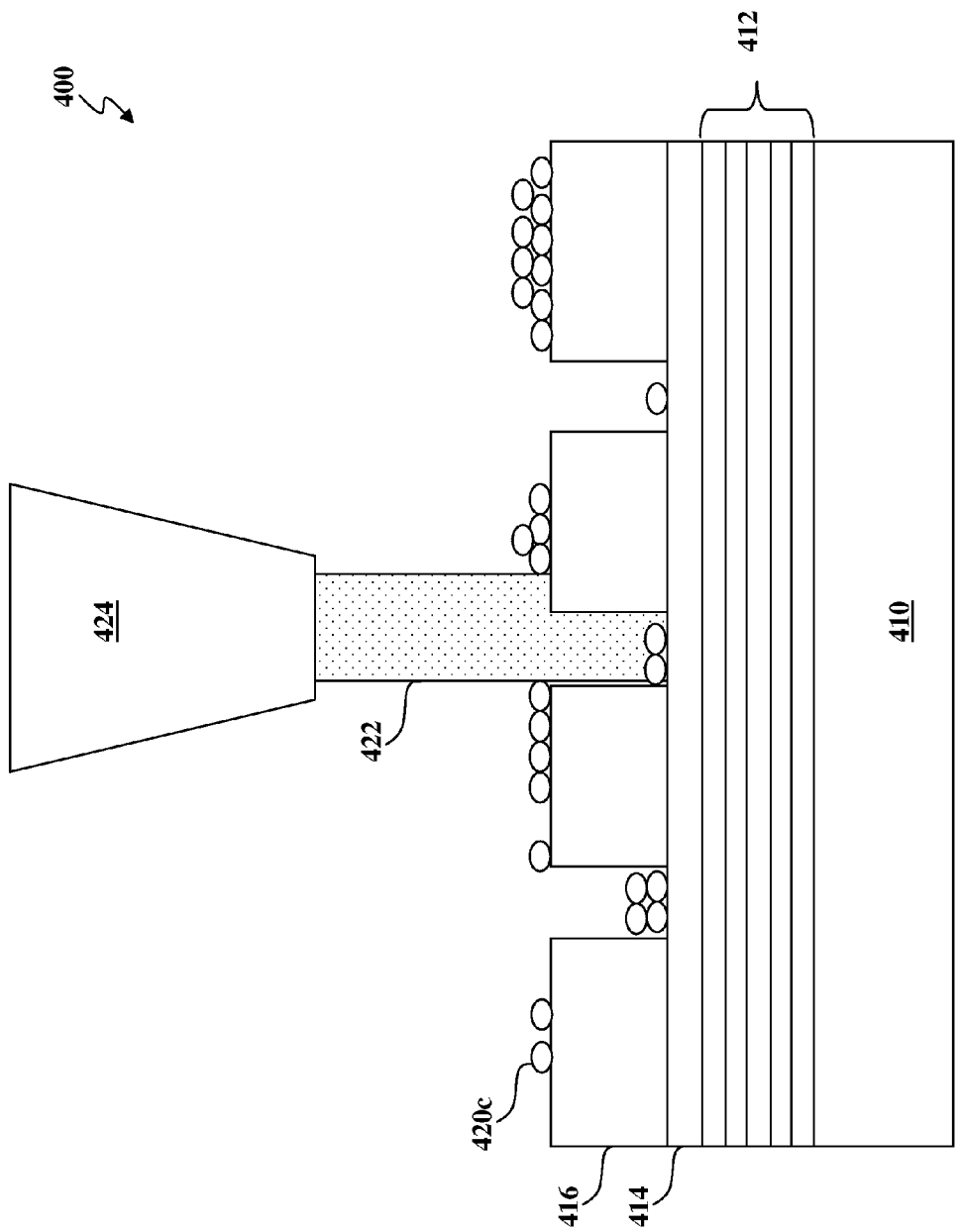

Referring to FIG. 10, in the present embodiment, after the etching process, the surface layer 418 is removed by any suitable process. For example, the surface layer 418 (photoresist) may be removed by a liquid "resist stripper", which chemically alters the resist so that it no longer adheres to the underlying hardmask. Alternatively, surface layer 418 may be removed by a plasma containing oxygen, which oxidizes it. Removing the surface layer 418 may further create debris 420 on exposed surfaces of the absorber 416 and the capping layer 414. After removing the surface layer 418, additional contamination debris 420c may be formed and present on all or some of the exposed surfaces. The contamination debris 420c may include the contamination debris 420b of FIG. 9 and/or contamination debris 420a of FIG. 8. In alternative embodiments, the surface layer 418 is removed during the cleaning process, as disclosed below.

Still referring to FIG. 10, a cleaning process is performed on the structure 400 to remove debris 420c or other contamination. In the present embodiment, performing the cleaning process includes exposing the contaminated structure 400 to a cleaning solution 422 including tetra methyl ammonium hydroxide (TMAH). In alternative embodiments, the cleaning solution 422 does not include TMAH but rather includes tetrabutylammonium hydroxide (TBAH). In still further embodiments, the cleaning solution 422 includes a combination of both TMAH and TBAH. The present embodiment will proceed with the cleaning solution including only TMAH, however, it is understood that the description that follows is equally applicable to the alternative embodiments that include TBAH or a combination of both TMAH and TBAH. In the present embodiment, the cleaning solution 422 further includes hydrogen peroxide ($H_2O_2$) and water ($H_2O$), thereby diluting the cleaning solution 422 including TMAH. As such, the cleaning solution 422 may a solution having a concentration of TMAH of less than about 2.38 wt %. For example, the cleaning solution 422 may be an ultra-dilute solution having a concentration of TMAH of from about 0.1 wt % to about 0.003 wt %. Because the TMAH concentration is an ultra-dilute solution, there is relatively little/minimal etching of certain materials, such as, for example, Si of a wafer and MoSi film, or other materials.

In the present embodiment, the cleaning solution 422 also includes a surfactant to enhance particle removal capability. The surfactant may be cationic, antonic, or nonionic surfactants. The surfactant, for example, may be a surfactant such as BASF C-2101, or any suitable surfactant. When the surfactant is put into the cleaning solution 422, it will readily dissolve if the surfactant concentration is low. The surfactant concentration may range from about 0.001% wt to about 1.0 wt %. Depending on the chemicals included and concentration of the respective chemicals, the cleaning solution 422 may have a pH ranging from about 7 to about 14. Notably, because in the present embodiment the chemical composition of the absorber 416 is Ag2O, using cleaning solution 422 that is ammonia (NH3) base chemical free may be beneficial as NH3 reacts with the Ag2O material of the absorber 416 thereby resulting in damage to the absorber 416. In alternative embodiments, however, where no such concerns are present, the cleaning solution 422 including NH3 may not have such adverse affects.

With further reference to FIG. 10, the structure 400 is exposed to the cleaning solution 400. The structure 400 may be exposed to the cleaning solution 422 by any appropriate processes. For example, the structure 400 may be dipped and/or immersed into the cleaning solution 422. Alternatively, the cleaning solution 422 may be sprayed on the exposed surface of the structure 400. The cleaning solution 422 may exposed to the structure 400 in conjunction with other process. For example, the cleaning solution 422 may be used with a high frequency system such as an ultrasonic/megasonic system to enhance particle removal without damage to the pattern formed on the structure 400. Further, for example, the cleaning solution 422 may be used during UV irradiation to remove particles and/or the surface layer (e.g., photoresist) if still present. It is understood that both the UV irradiation and the ultrasonic/megasonic system may be used together (at the same time) or separately (at different times). In the present embodiment, the structure 400 is exposed to the cleaning solution 422 using a high frequency ultrasonic/megasonic system 424. The ultrasonic/megasonic system 424 may include a unit including a transducer, a quartz window, a media inlet that receives the cleaning solution 422, and a nozzle tip that dispenses the cleaning solution 422. The ultrasonic/megasonic system 424 may provide vibration energy having a frequency range from about 100 kHz to about 9 MHz. Although the current embodiment depicts a single ultrasonic/megosonic system 424 unit, it is understood that the ultrasonic/megasonic system 424 may comprise multiple ultrasonic/megasonic system 424 units.

Figure 11:
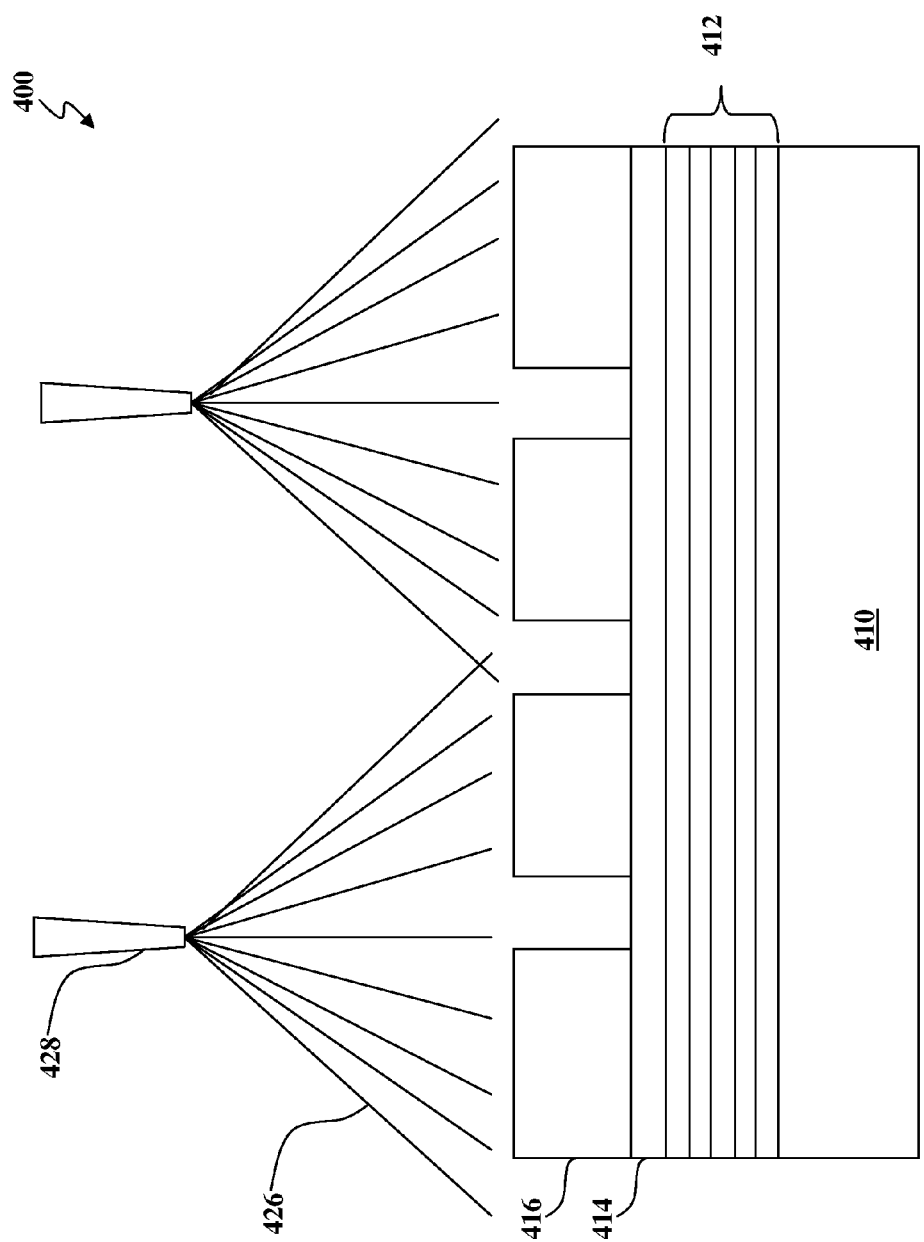

Referring to FIG. 11, after the structure 400 has been exposed to the cleaning solution 422 and the debris 420 and/or other contaminants have been substantially removed, the structure 400 is rinsed with a surfactant 426. Surfactant 426 aids in the removal of any cleaning solution 422 that remains and/or makes the surface hydrophobic, thereby preventing re-deposition of contaminants such as debris/particles, or other unwanted materials. The surfactant 426 may be cationic, antonic, or nonionic. The surfactant 426, for example, may be a surfactant such as BASF C-2101, or any suitable surfactant. The surfactant 426 is sprayed by one or more nozzle 428 onto the surface of the structure 400 to thereby rinse the structure 400. Alternatively, the structure 400 may be dipped and/or immersed into the surfactant 426, or the structure 400 may be exposed to the surfactant 426 by any suitable process, thereby rinsing the structure 400. In alternative embodiments, the structure 400 is not exposed to a surfactant after exposing the structure 400 to the cleaning solution 422.

The above methods 100 and 300 provide for a cleaning process using an improved cleaning solution including TMAH and H2O2 to form and clean various structures such as wafers and reticles/photomasks. The improved cleaning solution provides high zeta-potential and thereby enhances the cleaning capability of the cleaning process while providing for limited corrosion of layers/films such as MoSi or Si, or other layers, thereby allowing for improved critical dimensions (CD) and subsequent overlay control. Also, because the cleaning process using the improved cleaning solution does not require physical force (for example brushes) to remove contaminants, loss/corrosion of layers/films is further limited. Also, the improved cleaning solution may be combined with a surfactant to further enhance particle removal such as organic particles. Additionally, the improved cleaning solution can be utilized at high temperatures, for example by using UV lamp irradiation, during the cleaning process, thereby also allowing for the removal of a photoresist in a single cleaning step. The clean surface reduces manufacturing cost, cycle time, and provides for higher production yields, when compared with traditional manufacturing processes. Further, the methods described herein can be easily implemented into current manufacturing process and technology, thereby lowering cost and minimizing complexity. Different embodiments may have different advantages, and no particular advantage is necessarily required of any embodiment.

Thus, provided is a method. The exemplary method includes providing a substrate and forming one or more layers over the substrate. The method further includes forming a surface layer over the one or more layers. The method further includes patterning the surface layer. The method further includes performing a cleaning process using a cleaning solution to clean a top surface of the substrate. The cleaning solution includes tetra methyl ammonium hydroxide (TMAH), hydrogen peroxide ($H_2O_2$) and water ($H_2O$).

In some embodiments, the method further includes forming a capping layer over the one or more layers and under the surface layer; forming an absorber layer over the capping layer and under the surface layer; etching the absorber layer using the patterned absorber layer; and after etching the absorber layer, removing the surface layer. In further embodiments, the method may further include performing a rinsing process using a surfactant, wherein the substrate is part of a reticle and includes a material selected from the group consisting of quartz, a ultra low expansion (ULE) material, and a low thermal expansion material (LTEM), wherein the one or more layers includes molybdenum (Mo) and silicon (Si), wherein the absorber layer includes silver oxide (Ag2O), wherein the capping layer includes ruthenium (Ru), and wherein the concentration of TMAH in the cleaning solution ranges from about 0.1 wt % to about 0.003 wt %. In some embodiments the cleaning process is performed after the surface layer is removed by a stripping process, performing the cleaning process includes using a high frequency system, the cleaning solution is free of ammonia (NH3), and the cleaning solution includes a surfactant. In various embodiments, the cleaning process is performed before the surface layer is removed, the cleaning process includes using UV irradiation to thereby remove the surface layer, the cleaning solution is free of ammonia (NH3), and the cleaning solution includes a surfactant.

In some embodiments, the method further includes etching a top layer of the one or more layers using the patterned surface layer; and after etching the top layer of the one or more layers, removing the surface layer. In various embodiments, the method further includes performing a rinsing process using a surfactant, wherein the substrate is part of a wafer and includes silicon (Si), wherein the one or more layers includes Si, and wherein the concentration of TMAH in the cleaning solution ranges from about 0.1 wt % to about 0.003 wt %. In some embodiments, the cleaning process is performed after the surface layer is removed by a stripping process, the cleaning process includes using an high frequency system, and the cleaning solution includes a surfactant. In various embodiments, the cleaning process is performed before the surface layer is removed, the cleaning process includes using UV irradiation to thereby remove the surface layer, the cleaning solution includes a surfactant.

Also provided is an alternative embodiment of a method. The exemplary method includes providing a wafer including a substrate and forming a plurality of layers on the substrate. The method further includes forming a patterned surface layer having a plurality of openings on the plurality of layers. The method further includes etching a top layer of the plurality of layers through the plurality of openings of the patterned surface layer, wherein etching the top layer of the plurality of layers includes forming contamination debris on a surface of the top layer of the plurality of layers. The method further includes performing a cleaning process using a cleaning solution to remove the contamination debris, wherein the cleaning solution includes tetra methyl ammonium hydroxide (TMAH), hydrogen peroxide ($H_2O_2$) and water ($H_2O$). the concentration of TMAH in the cleaning solution ranges from about 0.1 wt % to about 0.003 wt %.

In some embodiments, the method further includes after etching the top layer of the plurality of layers and before performing the cleaning process, removing the surface layer; and after performing the cleaning process, performing a rinsing process using a surfactant. In various embodiments, the method further includes after etching the top layer of the plurality of layers, removing the surface layer during the cleaning process by using UV irradiation; and after performing the cleaning process, performing a rinsing process using a surfactant. In some embodiments, the cleaning solution includes a surfactant.

Also provided is yet another alternative method. The exemplary method includes providing a reticle including a substrate and forming a plurality of layers on the substrate. The method further includes forming an intermediate layer on the plurality of layers. The method further includes forming a patterned surface layer having a plurality of openings on the intermediate layer. The method further includes etching the intermediate layer through the plurality of openings of the patterned surface layer. Etching the intermediate layer includes forming contamination debris on a surface of the intermediate layer. The method further includes performing a cleaning process using a cleaning solution to remove the contamination debris, wherein the cleaning solution includes tetra methyl ammonium hydroxide (TMAH), hydrogen peroxide ($H_2O_2$) and water ($H_2O$). The concentration of TMAH in the cleaning solution ranges from about 0.1 wt % to about 0.003 wt %.

In some embodiments, the method further includes after etching the intermediate layer and before performing the cleaning process, removing the surface layer; and after performing the cleaning process, performing a rinsing process using a surfactant. In various embodiments, the method further includes after etching the intermediate layer, removing the surface layer during the cleaning process by using UV irradiation; and after performing the cleaning process, performing a rinsing process using a surfactant.

In some embodiments, performing the cleaning process includes using an high frequency system. In various embodiments, the reticle is an extreme ultraviolet (EVU) reticle, the substrate includes a material selected from the group consisting of a ultra low expansion (ULE) material and a low thermal expansion material (LTEM), the plurality of layers include alternating layers of molybdenum (Mo) and silicon (Si), and the intermediate layer is an absorber including silver oxide (Ag2O). In further embodiments, the cleaning solution is free of ammonia (NH3), and the cleaning solution includes a surfactant. In certain embodiments, the intermediate layer is less than about 32 nanometers (nm) thick.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing comprising:
   forming one or more layers over a substrate;
   forming a surface layer over the one or more layers,
   patterning the surface layer;
   after patterning the surface layer, performing a cleaning process using a cleaning solution to clean a top surface of the substrate, wherein the cleaning solution includes hydrogen peroxide ($H_2O_2$) and water ($H_2O$), and at least one of tetra methyl ammonium hydroxide (TMAH) and tetrabutylammonium hydroxide (TBAH);
   forming a capping layer over the one or more layers and under the surface layer;
   forming an absorber layer over the capping layer and under the surface layer;
   after patterning the surface layer, etching the absorber layer using the surface layer; and
   after etching the absorber layer, removing the surface layer.

2. The method of claim 1 further comprising:
   performing a rinsing process using a surfactant,
   wherein the substrate is part of a reticle and includes a material selected from the group consisting of quartz, a ultra low expansion (ULE) material, and a low thermal expansion material (LTEM),
   wherein the one or more layers include alternating layers of molybdenum (Mo) and silicon (Si),
   wherein the absorber layer includes silver oxide ($Ag_2O$),
   wherein the capping layer includes ruthenium (Ru), and
   wherein the concentration of TMAH in the cleaning solution ranges from about 0.1 wt % to about 0.003 wt %.

3. The method of claim 1 wherein the cleaning process is performed after the surface layer is removed by a stripping process,
   wherein performing the cleaning process includes using a high frequency system,
   wherein the cleaning solution is free of ammonia ($NH_3$), and
   wherein the cleaning solution includes a surfactant.

4. The method of claim 1 wherein the cleaning process is performed before the surface layer is removed,
   wherein the cleaning process includes using UV irradiation to thereby remove the surface layer,
   wherein the cleaning solution is free of ammonia ($NH_3$), and
   wherein the cleaning solution includes a surfactant.

5. The method of claim 1 further comprising:
   performing a rinsing process using a surfactant,
   wherein the substrate is part of a wafer and includes silicon (Si),
   wherein the one or more layers include Si, and
   wherein the concentration of TMAH in the cleaning solution ranges from about 0.1 wt % to about 0.003 wt %.

6. The method of claim 5 wherein the cleaning process is performed after the surface layer is removed by a stripping process,
   wherein the cleaning process includes using a high frequency system, and
   wherein the cleaning solution includes a surfactant.

7. The method of claim 5 wherein the cleaning process is performed before the surface layer is removed,
   wherein the cleaning process includes using UV irradiation to thereby remove the surface layer, and
   wherein the cleaning solution includes a surfactant.

8. The method of claim 1, wherein the concentration of TMAH in the cleaning solution is less than about 2.38 wt %.

9. A method of manufacturing comprising:
   forming a plurality of layers on a substrate;
   forming a patterned surface layer having one or more openings on the plurality of layers;
   etching a top layer of the plurality of layers through the one or more openings of the patterned surface layer, wherein etching the top layer of the plurality of layers includes forming contamination debris on a surface of the top layer of the plurality of layers;
   performing a cleaning process using a cleaning solution to remove the contamination debris, wherein the cleaning solution includes tetra methyl ammonium hydroxide (TMAH), hydrogen peroxide ($H_2O_2$) and water ($H_2O$), wherein the concentration of TMAH in the cleaning solution is less than about 2.38 wt %;
   after etching the top layer of the plurality of layers and before performing the cleaning process, removing the surface layer; and
   after performing the cleaning process, performing a rinsing process using a surfactant.

10. The method of claim 9
    wherein removing the surface layer during the cleaning process includes using UV irradiation.

11. The method of claim 9 wherein the cleaning solution includes a surfactant.

12. The method of claim 9, wherein the cleaning solution includes tetrabutylammonium hydroxide (TBAH).

13. A method comprising:
    providing a reticle including a substrate;
    forming a plurality of layers on the substrate;
    forming an intermediate layer on the plurality of layers;
    forming a patterned surface layer having one or more openings on the intermediate layer;
    etching the intermediate layer through the one or more openings of the patterned surface layer, wherein etching the intermediate layer includes forming contamination debris on a surface of the intermediate layer; and
    performing a cleaning process using a cleaning solution to remove the contamination debris, wherein the cleaning solution includes tetra methyl ammonium hydroxide (TMAH), hydrogen peroxide ($H_2O_2$) and water ($H_2O$),
    wherein the concentration of TMAH in the cleaning solution ranges from about 0.1 wt % to about 0.003 wt %.

14. The method of claim 13 further comprising:
    after etching the intermediate layer and before performing the cleaning process, removing the surface layer; and
    after performing the cleaning process, performing a rinsing process using a surfactant.

15. The method of claim 13 further comprising:
    after etching the intermediate layer, removing the surface layer during the cleaning process by using UV irradiation; and after performing the cleaning process, performing a rinsing process using a surfactant.

16. The method of claim 13 wherein performing the cleaning process includes using a high frequency system.

17. The method of claim 13 wherein the reticle is an extreme ultraviolet (EVU) reticle,
   wherein the substrate includes a material selected from the group consisting of an ultra low expansion (ULE) material and a low thermal expansion material (LTEM),
   wherein the plurality of layers include alternating layers of molybdenum (Mo) and silicon (Si), and
   wherein the intermediate layer is an absorber including silver oxide ($Ag_2O$).

18. The method of claim 17 wherein the cleaning solution is free of ammonia ($NH_3$), and
   wherein the cleaning solution includes a surfactant.

19. The method of claim 17 wherein the intermediate layer is less than about 32 nanometers (nm) thick.

20. The method of claim 13, wherein the cleaning solution includes tetrabutylammonium hydroxide (TBAH).

\* \* \* \* \*